United States Patent [19]

Lockwood et al.

[11] 3,991,339
[45] Nov. 9, 1976

[54] LIGHT EMITTING DIODE WITH REFLECTOR

[75] Inventors: Harry Francis Lockwood, New York, N.Y.; Michael Ettenberg, Freehold, N.J.; Henry Kressel, Elizabeth, N.J.; Jacques Isaac Pankove, Princeton, N.J.

[73] Assignee: RCA Corporation, New York, N.Y.

[22] Filed: May 27, 1975

[21] Appl. No.: 581,044

[52] U.S. Cl. .............................. 313/499; 313/113; 357/17
[51] Int. Cl.² ...................................... H05B 33/22
[58] Field of Search ............... 313/499, 113; 357/17

[56] References Cited
UNITED STATES PATENTS

| | | | |
|---|---|---|---|
| 3,701,047 | 10/1972 | Caplan et al. | 313/499 X |
| 3,821,775 | 6/1974 | Biard | 313/499 X |
| 3,877,052 | 4/1975 | Dixon et al. | 357/17 |

*Primary Examiner*—Palmer C. Demeo
*Attorney, Agent, or Firm*—G. H. Bruestle; D. N. Calder

[57] ABSTRACT

An electroluminescent semiconductor device having an optical axis includes two cylindrical surface segments spaced from and opposite each other. One of the cylindrical surface segments is the light emitting surface with a center of curvature $C_1$ and a focal point, $f$, on the optical axis. The other cylindrical surface segment is a light reflecting surface having a center of curvature $C_2$ on the optical axis. The electroaluminescent device has a pair of flat surfaces, spaced from each other and substantially perpendicular to the light emitting and reflecting surfaces. On one of the flat surfaces is a first electrical contact. On a portion of the opposite flat surface is a second electrical contact which is positioned along the optical axis on or between the center of curvature $C_1$ and the focal point $f$. Light is generated in the electroluminescent device in the area of the second contact. Preferably, if the focal point $f$ and center of curvature $C_2$ are at the same location on the optical axis the benefits to light emission are two fold. First, the light emitted from such a point will be collimated and secondly light striking the reflected surface will be reflected back to the focal point $f$ thereby improving the possibility of its emission as collimated light.

11 Claims, 3 Drawing Figures

LIGHT EMITTING DIODE WITH REFLECTOR

The invention herein disclosed was made in the course of or under a contract or subcontract thereunder with the Department of the Navy.

BACKGROUND OF THE INVENTION

This invention relates to electroluminescent devices and more particularly to electroluminescent devices whose radiating light is columnated, i.e. forms a parallel beam.

In the field of electroluminescent devices, i.e., light emitting diodes and lasers, the light emanating from the emitting surface has a divergent quality. Divergent light is light whose beam spreads as it travels from its source. Divergence of emitted light is troublesome when it is desirable to couple an electroluminescent device to an external optical system. The divergence of the emitted light makes it difficult to assume that all of the light will be coupled into the external optical system. Therefore, it would be most desirable to have an electroluminescent device whose emitted light beam is substantially collimated for optical coupling.

SUMMARY OF THE INVENTION

An electroluminescent semiconductor device includes a body of semiconductor material with a pair of opposed, substantially flat, spaced surfaces. A pair of contiguous regions of opposite conductivity type from a P-N junction spaced from and between the pair of spaced surfaces. A light emitting surface extends between the spaced surfaces substantially perpendicular to and across the P-N junction. The light emitting surface is in the shape of a cylindrical segment having its center of curvature and focal point within the body and along an optical axis which crosses the body. Also between the spaced surfaces is a light reflecting surface which is spaced from and opposite to the light emitting surface. The light reflecting surface is in the shape of a cylindrical segment having a center of curvature within the body and on the optical axis. A first electrical contact is on one of the spaced surfaces. A second electrical contact is on the other spaced surface and at a location on the optical axis on or between the focal point of the light emitting surface and the center of curvature of the light reflecting surface, so that light generated in the body is generated in the area between the first and second contacts.

DETAILED DESCRIPTION OF THE INVENTION

Figure 1:
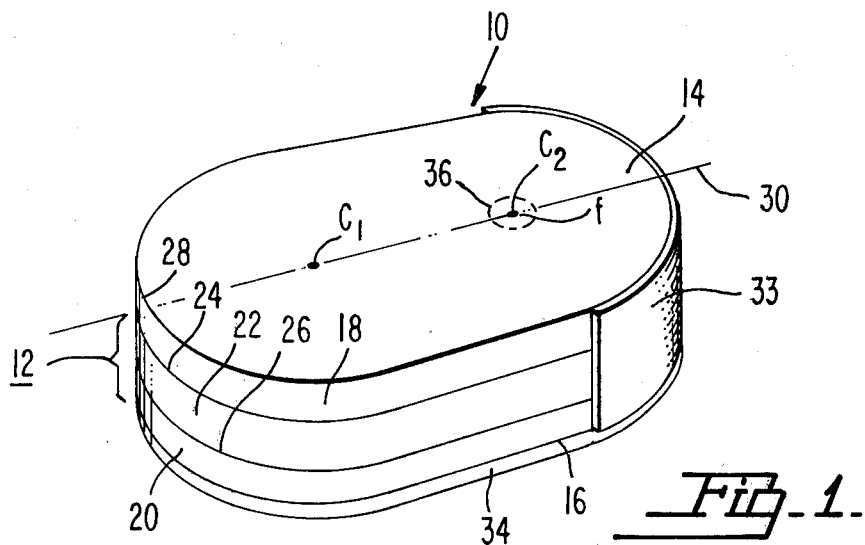
FIG. 1 is a perspective view of a first embodiment of the electroluminescent semiconductor device of the present invention.

Referring to FIG. 1, a first embodiment of the electroluminescent semiconductor device of the present invention is designated as 10. The electroluminescent semiconductor device 10 is hereinafter described as an edge-emitting, light emitting diode. The electroluminescent device 10 includes a body 12 of semiconductor material having light generating properties and preferably of the class of the group III-V semiconductor materials and their alloys. The body 12 has a pair of spaced, substantially flat surfaces 14 and 16. At the flat surface 14 is a first region 18 of one conductivity type, and at the flat surface 16, spaced from the first region 18, is a second region 20 of the opposite conductivity type. Between and contiguous to both first and second regions 18 and 20 is a third region 22 of either conductivity type, having a first and second junction 24 and 26 respectively between the first and second regions 18 and 20. The first, second and third regions 18, 20 and 22 are the active regions of the electroluminescent semiconductor device 10. The first and secnd regions 18 and 20 are of a semiconductor material of higher band gap energy than the semiconductor material of the third region 22. For example, the first and second regions 18 and 20 may be of aluminum gallium aresenide, while the third region 22 is of gallium arsenide. Since the first and second regions 18 and 20 are of a different semiconductor material than the third region 22, the first and second junctions 24 and 26 are heterojunctions. Also, for purposes of description, the first region 18 is of N-type conductivity while the second and third regions 20 and 22 are P-type conductivity. Thus, the first junction 24 is a P-N heterojunction.

Figure 2:
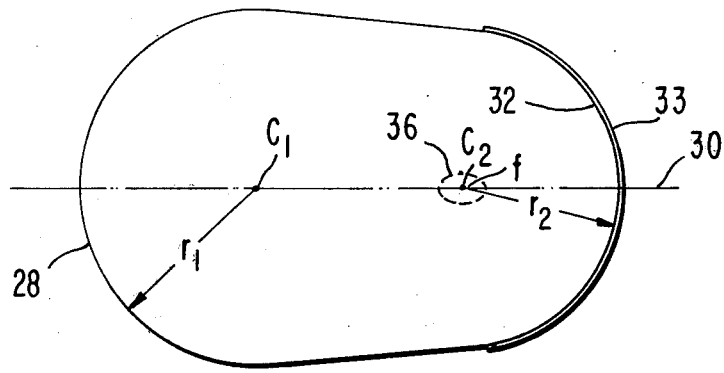
FIG. 2 is a top view of the electroluminescent semiconductor device shown in FIG. 1.

Referring to FIG. 2, the semiconductor body 12 has a light emitting surface 28, in the shape of a cylindrical segment, extending between the flat surfaces 14 and 16 and approximately perpendicular to and across the P-N junction 24. The light emitting surface 28 has a radius of curvature $r_1$, with a center of curvature $C_1$ in the body 12. A focal point, $f$, or the light emitting surface 28, also in the body 12, is determined by the formula:

$$\left( f = \frac{r_0 \, r_1}{r_0 - 1} \right)$$

where $r_1$ is the radius of curvature of the light emitting surface 28 and $r_0$ is the index of refraction of the third active region 22 of the electroluminescent device 10. The focal point, $f$, is the point from which all light generated in the electroluminescent device 10 and traversing the light emitting surface 28 is collimated as it emerges from the light emitting surface 28. An optical axis 30 of the electroluminescent device 10 is a line which passes through both the center of curvature $C_1$ and focal point, $f$, of the light emitting surface 28.

Spaced from and opposite the light emitting surface 28 is a light reflecting surface 32, in the shape of a cylindrical segment, extending between the flat surfaces 14 and 16. The light reflecting surface 32 has a radius of curvature $r_2$, with a center of curvature $C_2$ in the body 12 and on the optical axis 30. The light reflecting surface 32 can be made light reflecting by being polished or as shown in FIGS. 1 and 2 by having a reflecting layer 33 on the reflecting surface 32. The reflecting layer 33 is of a material or materials having good light reflecting properties such as a multilayer dielectric material like zinc sulfide and silicon dioxide, or it may be of a first layer of an electrical insulating material on the reflecting surface 32, such as silicon dioxide with a second layer of a metal, such as gold, on the insulating layer.

A first electrical contact 34 is on the flat surface 16 of the second region 20. The first electrical contact 34 is of a metallic material having good electrical conductivity properties with the semiconductor material of the second region 20. Typically, the first electrical contact 34 is of a layer of a good wetting material on the second region 20, such as chromium, with a layer of a good conducting material, such as gold, on the layer of wetting material. The wetting material assures adherence of the good conducting material. Preferably, the first electrical contact 34 will be on the entire flat surface 16, since, as is well known in the art, this would provide an electrical contact with a lower series resistance than a contact on only a small portion of the surface 16.

A second electrical contact 36 is on the flat surface 14, along the optical axis 30, anywhere on or between the focal point, f, and the center of curvature $C_1$. For purposes of this description the second electrical contact 36 is elliptical in shape. Like the first electrical contact 34, the second electrical contact 36 is of a metallic material having good electrical conductivity, and preferably consists of a layer of wetting material and a layer of conducting material.

In the operation of the electroluminescent semiconductor device 10, when a forward bias is applied to the P-N heterojunction 24, some of the conduction band electrons from the first region 18 are allowed to diffuse across the P-N heterojunction 24. Electrons in the N-type first region 18 are majority carriers and become minority carriers in the P-type third region 22. Thus, once electrons diffuse across the P-N heterojunction 24, these minority carriers then recombine with the many oppositely charged majority carriers. This recombination of minority carrier within a diffusion length of the P-N heterojunction 24 is the mechanism by which light (electroluminescence) is generated. An important property of the P-N heterojunction 24, is that there is a barrier which opposes the diffusion of holes from the third region 22 which is higher than the barrier which opposes the diffusion of electrons from the first region 18. Hence the recombination process is confined to the third region 22. Also well known in the art is that the P-N heterojunction 24 and the second heterojunction 26 somewhat confine the light generated to the third region 22.

The forward bias current flowing through the electroluminescent device 10 as a result of the forward biasing of the first and second electrical contacts 34 and 36, is limited to flowing through only a portion of the first, second and third regions 18, 20 and 22. This confinement of the current flow is a result of the second contact 36 being on only a portion of the flat surface 14. Current will only flow through the three active regions 18, 20 and 22, in the general area under the second contact 36. Since the current is confined to a portion of the three active regions 18, 20 and 22, the light generated in these active regions is also limited to this general area of current flow.

In the following discussion on the operation of the electroluminescent device 10, it is assumed that the second electrical contact 36 is a point contact.

The light emitting surface 28 separates two mediums each having a different index of refraction, i.e. the semiconductor body 12 has a higher index of refraction than the air surrounding the electroluminescent device 10. Light travelling through materials having different indices of refraction, from the material of higher to the material of lower index of refraction is at the interface of the materiaLs, either totally reflected back into the material having the higher index of refraction if it strikes the interface at an angle greater than the critical angle or is partially reflected and partially refracted at the interface, if it strikes the interface at an angle less than the critical angle. Well known in the field of optics is that the shape of the light emitting surface 28, i.e. a cylindrical segment, gives it the properties of a converging lens. Also, well known in the field of optics is that light radiating from a light source at the focal point, f, of a converging lens and subsequenting striking the lens will be refracted, so as to be collimated, beyond the lens. Columnated light is light in which all the rays are parallel to each other. Thus, light generated at the focal point, f, of the cylindrical shaped light emitting surface 28, traversing the semiconductor material of the device 10 and then striking the light emitting surface 28, will be collimated as it travels away from the emitting surface 28.

Light radiating from the center of curvature of a cylindrical surface segment, such as $C_1$ of light emitting surface 28, will strike this surface at an angle of 90°, so that even if the light traverses from a medium of higher index of refraction to one of a lower index of refraction the light passing through the surface is not refracted or reflected. Such light is not collimated but each ray continues on the same straight path through both mediums, being divergent with respect to each other. As the light source is moved along the optical axis from the center of curvature $C_1$ to the focal point, f, the light emitted from the emitting surface 28 is decreasing divergent and increasing collimated until it is totally collimated at the focal point, f. Light generated at a point on the optical axis between the focal point, f, and the light reflecting surface 32, is refracted at the emitting surface 28 so as to be converging.

If a cylindrical surface segment were made to be light reflecting, such as light reflecting surface 32, the light radiating from the center of curvature of such a reflecting surface and then impinging the reflecting surface, is reflected directly back into the center of curvature.

From what has been disclosed above, it can be seen that as the second electrical contact 36 is moved along the optical axis 30, from the center of curvature $C_1$ to the focal point f of the light emitting surface 28, the light radiating from the emitting surface 28 becomes increasingly collimated, until it is at the focal point f, in which instance the light is totally collimated. What must also be considered is if the second contact 36 were at the center of curvature $C_2$, all the light reflected off of reflecting surface 32 would travel back to the center of curvature $C_2$.

In the electroluminescent semiconductor device 10, preferably the focal point f and the center of curvature $C_2$ should be at the same point on the flat surface 14. Having the second electrical contact 36 at such a location would provide the two-fold benefit as described above. First, light generated at the combined focal point f and center of curvature $C_2$ and radiating from the emitting surface 28 is refracted at the surface 28 so as to be collimated. Secondly, light generated at the combined focal point f and center of curvature $C_2$ and striking the reflecting surface 32 is reflected directly back to the combined point, thus, increasing the possibility that such light may be emitted from the emitting surface 28 and be collimated.

In discussing the operation of the electroluminescent device 10, it has been assumed that the second electrical contact 36 is a point contact. In the actual operation of the electroluminescent device 10 a point contact may not be desirable, for example, because of the high current density at the point contact if the device 10 were a light emitting diode. A more desirable shape for the second contact 36 would be that of an elipse, as shown in FIGS. 1 and 2 by dashes, with the semi-major axis of the elipse along the optical axis 30 and the center of the elipse at a point which is both the focal point $f$ and the center of curvature $C_2$, not shown in FIGS. 1 and 2.

While having the second contact 36 in the form of an elipse may be more practical than its being a point contact, not all the light generated in the general area of the second contact 36 will be collimated as it radiates from the emitting surface 28. Since not all the light generated by the eliptical second contact 36 is generated at the focal point $f_1$, some light rays generated will be divergent and some other rays will be convergent as they radiate from the emitting surface 28. Thus, the radiating light is not totally collimated, but the extent to which it deviates from totally collimated light can be determined by the size of the eliptical contact 36. The larger the eliptical second contact 36, consequently more light will be generated farther from the focal point $f$. In addition, the extent to which light radiating from the emitting surface 28 can deviate from collimated light is also dependent on the numerical aperture (N.A.) of the external optical system into which the radiating light is to be coupled (not shown). Typically, the numerical aperture is equal to the sin $\alpha$ where the angle $\alpha$ is the maximum angle of acceptance for a generated light ray incident onto the external optical system. Thus, in determining the size of the eliptical second contact 36 along its semi-major and semi-minor axis, the acceptance angle of the external optical system must be taken into consideration.

While a second contact 36 has been discussed in the shape of a point and an elipse, it is anticipated by the electroluminescent device 10 of the present invention that the second contact 36 can be in the shape of a circle or a line along the optical axis 30. Again, the size of a second contact 36 in the shape of a circle or line is determined by how much of a deviation from collimated light can be accepted by an external optical system. If the second contact 36 is a circle it should have a radius no greater than one-half the radius of curvature of the reflecting surface 32. While it is preferable that the center of curvature $C_2$ be at focal point, $f$, it is acceptable that $C_2$ be spaced from $f$ along the optical axis in either direction, no greater than a distance whereby the second contact 36 which is on or between the center of curvature $C_2$ and focal point, $f$, will generate light emerging from the emitting surface 28 at an angle acceptable to the numerical aperture of an external optical system.

In the fabrication of the first embodiment of the present invention, first a semiconductor wafer comprising the active regions of the electroluminescent device 10 can be made by either state of the art liquid phase; vapor phase or diffusion techniques. From the wafer a body of semiconductor material in the shape of body 12, i.e., having a pair of spaced cylindrical surface segments and a pair of spaced flat surfaces, is cut by using either a laser cutter or an ultra-sonic impact tool. Evaporated onto a flat surface of the second region 20 of the body 12 is a metallic layer. This metallic layer is the first contact 34. A mask having a hole in it, is then placed on the other flat surface of the body 12. When the mask is placed on the flat surface the mask's hole is positioned on the flat surface at the location of the second contact 36. Subsequently, the second contact 36 is formed by placing the body and mask in the evaporation chamber and evaporating a metal having good conductive properties on the mask and on the flat surface at the mask's hole. Next, reflecting layer 33 is formed by evaporating an electrically insulating layer such as silicon dioxide on the reflecting surface 32 and then a layer of material having good light reflecting qualities. Fabrication of the electroluminescent device 10 is completed by connecting electrical leads to the first and second contacts 34 and 36. In the first embodiment of the present invention the first region 18 is of N-type conductivity and the second and third regions 20 and 22 are of P-type conductivity, but it is anticipated by the present invention that the first region 18 may be of P-type conductivity with the second and third regions 20 and 22 of N-type conductivity. It is also anticipated by the present invention that the active regions of the device 10 can be of any number of regions in which electroluminescent can be achieved.

Figure 3:
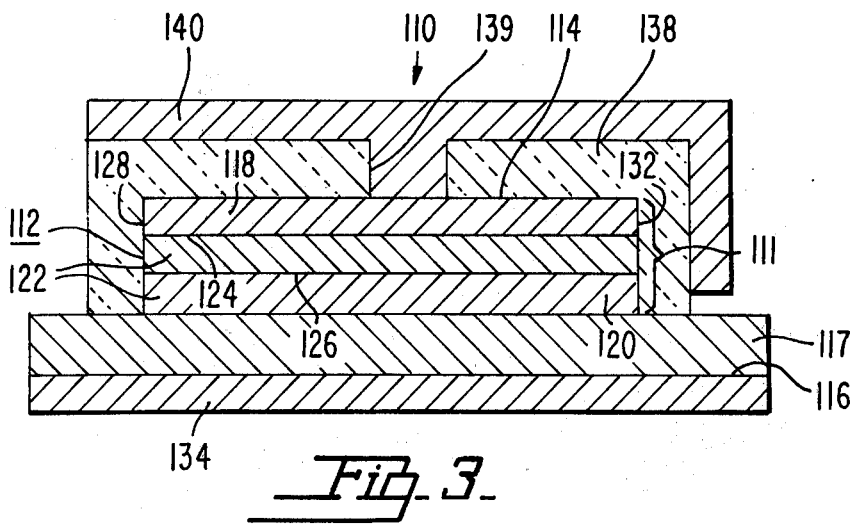
FIG. 3 is a cross-sectional view of a second embodiment of the electroluminescent semiconductor device of the present invention.

Referring to FIG. 3, a second embodiment of the electroluminescent semiconductor device of the present invention is designated as 110. The second embodiment, electroluminescent device 110, is very similar to the first embodiment, electroluminescent device 10, with the exception of two differences. One difference between the first and second embodiments is that the body 112 of electroluminescent device 110 is in the form of a mesa 111, on a substrate 117. The mesa 111 has a flat surface 114 and the substrate has a flat surface 116 spaced from and opposite the flat surface 114. A first, second, and third regions 118, 120 and 122 are in the mesa 111. The first region 118 is at the surface 114. The third region 122 is between and contiguous to the first and second regions 118 and 120 with a first junction 124 between the first and third regions 118 and 122 and a second junction 126 between the second and third regions 120 and 122. The second region 120 is in contact with the substrate 117 at a surface opposite the second junction 126. The first, second and third regions 118, 120 and 122, and the first and second junctions 124 and 126 are the same as the first, second and third regions 18, 20 and 22 and first and second junctions 24 and 26 of the first embodiment of the present invention. The substrate 117 is of a high conductivity material suitable for the growth of the semiconductor materials of the first, second and third regions 118, 120, and 122.

The active regions 118, 120 and 122 of the electroluminescent device 110 have an optical axis 130 the same as the optical axis 30 of the electroluminescent device 10. Also, the active regions 118, 120 and 122 in the mesa 111, have a common light emitting surface 128 and common light reflecting surface 132 the same as light emitting surface 28 and light reflecting surface 32 of the first embodiment. On the flat surface 116 is a first electrical contact 134. First electrical contact 134 is the same as the first electrical contact 34 of the first embodiment.

Unlike the first embodiment, the electroluminescent device 110 has an oxide layer 138 on the body 112, except for flat surface 116 on which is the first electrical contact 134. The oxide layer has an opening 139 therethrough to the flat surface 114. The opening 139 is in the shape of and positioned on the flat surface 114 to correspond with the second contact 36 of the first embodiment. Typically, the oxide layer 138 is of an oxide material such as silicon monoxide, silicon dioxide or aluminum oxide. If the oxide layer 138 is of thickness equal to $$\frac{\lambda}{4n1}$$

where "λ" is the wavelength of light radiating from the emitting surface 128 and "n" is the index of refraction of the oxide material, it will function as an anti-reflection layer on the light emitting surface 128. With light emission from the emitting surface 128 at a wavelength of 9000A, an oxide layer 138 on the emitting surface 128 of 1500A thickness will provide anti-reflection.

A metallic layer 40 is on that portion of the oxide layer 138 which is in contact with the flat surface 114 and reflecting surface 132, and in the opening 139 on flat surface 114. The metallic layer 140 on that portion of oxide layer 138 which is on reflecting surface 132 should not contact substrate 117 so that metallic layer 140 and substrate 117 are electrically insulated from each other. The metallic layer 140 is of a metal having good electrical conductivity and light reflecting properties. The portion of metallic layer 140 in the opening 139 functions as the second electrical contact 36 of the first embodiment and that portion of the metallic layer 140 on the oxide layer 138 and opposite the reflecting surface 132 functions as the reflecting layer 33 of the first embodiment. The entire metallic layer 140 functions as a heat sink for the electroluminescent device 110.

The operation of the electroluminescent device 110 is the same as the operation of the electroluminescent device 10.

In the fabrication of the second embodiment of the present invention, first a semiconductor body comprising the active regions and the substrate is formed by either state of the art liquid phase, vapor phase or diffusion techniques. The wafer is placed in an evaporation chamber and a metallic layer is evaporated on the surface of the substrate opposite the active regions, thereby making the first electrical contact 134. Next, photoresist and masking techniques well known in the art are utilized to etch away part of the body and thereby forming the mesa 111. Next, an oxide layer of silicon dioxide is evaporated onto the entire mesa 111. Again, photoresist techniques well known in the art are utilized this time to form the opening 139 on the oxide layer. Next, the semiconductor body is placed in an evaporation chamber for evaporation of a metallic layer. The body is tilted in the chamber such that the metallic layer is deposited on that portion of the oxide layer which is on the flat surface 114, in the opening 139 and on the reflecting surface 132. This metallic layer is metallic layer 140 of the second embodiment of the present invention. Fabrication of the electroluminescent device 110 is then completed by contacting electrical leads to the first contact 134 and metallic layer 140.

The advantage of the second embodiment over that of the first is that it may be easier to fabricate the active regions of the second embodiment since it requires an etching, then to form these active regions by a cutting process as done in the first embodiment.

Both first and second embodiments of the present invention provide an electroluminescent semiconductor device whose radiating light is collimated to provide good optical coupling to an external optical system.

We claim:
1. An electroluminescent semiconductor device comprising:
    a body of semiconductor material having a pair of opposed, substantially flat, spaced surfaces,
    a pair of contiguous regions of opposite conductivity type forming a P-N junction spaced from and between said pair of spaced surfaces,
    a light emitting surface extending between said spaced surfaces substantially perpendicular to and across said P-N junction, said light emitting surface being in the shape of a cylindrical segment having its center of curvature and focal point within said body and along an optical axis which crosses said body,
    a light reflecting surface between said spaced surfaces, spaced from and opposite to said light emitting surface, said light reflecting surface being in the shape of a cylindrical segment having a center of curvature within said body and on said optical axis,
    a first electrical contact on one of said spaced surface; and
    a second electrical contact on said other spaced surface, at a location on the optical axis on or between the focal point of said light emitting surface and the center of curvature of said light reflecting surface, such that light generated in said body is generated in the area between said first and second contacts.
2. The electroluminescent device in accordance with claim 1 wherein the center of curvature of said light reflecting surface is spaced from the focal point no greater than a distance whereby the light emitted from said device is at an acceptable angle of deviation from light which is collimated.
3. The electroluminescent semiconductor device in accordance with claim 1, wherein the focal point of said light emitting surface and the center of curvature of said light reflecting surface are at the same location on the optical axis.
4. The electroluminescent semiconductor device in accordance with claim 3, wherein said second electrical contact is centered on said optical axis at said location of the focal point of said light emitting surface and the center of curvature of said light reflective surface.
5. The electroluminescent semiconductor device in accordance with claim 4, wherein said second electrical contact is in the shape of an elipse, with the semimajor axis of said elipse along said optical axis.
6. The electroluminescent semiconductor device in accordance with claim 4, wherein said second electrical contact is in the shape of a line, which is on the optical axis.
7. The electroluminescent semiconductor device in accordance with claim 4, wherein said second electrical contact is in the shape of a circle whose diameter is no greater than one-half the radius of curvature of said reflecting surface.
8. The electroluminescent semiconductor device in accordance with claim 4, wherein a reflecting layer is on said reflecting surface.
9. The electroluminescent semiconductor device in accordance with claim 4, wherein said body includes a first region of one conductivity type at one flat surface, a second region of an opposite conductivity type at the other flat surface, and a third region of either conductivity type, contiguous and between said first and second regions.

10. An electroluminescent semiconductor device comprising:
- a body of semiconductor material in the form of a mesa on a substrate, said mesa having a substantially flat surface, said substrate having another substantially flat surface spaced from and opposite the flat surface of the mesa,
- a pair of contiguous regions of opposite conductivity type in the mesa forming a P-N junction spaced from and between said flat surface of said mesa and said substrate,
- a light emitting surface extending between said flat surface of said mesa and said substrate, substantially perpendicular to and across said P-N junction, said light emitting surface being in the shape of a cylindrical segment having its center of curvature and focal point within said mesa and along an optical axis which crosses said mesa,
- a light reflecting surface between said flat surface of said mesa and said substrate, spaced from and opposite to said light emitting surface, said light reflecting surface being in the shape of a cylindrical segment having a center of curvature within said body and on the optical axis,
- an oxide layer on said body, except for the flat surface of said substrate, with an opening in said oxide layer therethrough to the flat surface of said mesa, said opening being at a location on the optical axis on or between the focal point of said light emitting surface and the center of curvature of said light reflecting surface,
- an electrical contact on the flat surface of said substrate, and
- a metallic layer on the portion of said oxide layer which is on the flat surface of said mesa, on said light reflecting surface, and said metallic layer is in the opening of said oxide layer.

11. The electroluminescent semiconductor device in accordance with claim 10, wherein said oxide layer is silicon dioxide.

* * * * *